United States Patent [19]
Iga et al.

[11] Patent Number: 5,241,554
[45] Date of Patent: Aug. 31, 1993

[54] LASER DIODE OF VARIABLE BEAM DIVERGENCE AND INFORMATION PROCESSOR USING THE SAME

[75] Inventors: Kenichi Iga, Machida; Kazuto Senda, Hachiouji, both of Japan

[73] Assignee: Hitachi, Ltd., Tokyo, Japan

[21] Appl. No.: 747,189

[22] Filed: Aug. 19, 1991

[30] Foreign Application Priority Data

Aug. 21, 1990 [JP] Japan ................. 2-219550

[51] Int. Cl.⁵ ............................................... H01S 3/19
[52] U.S. Cl. .................................. 372/46; 369/44.23; 369/275.2
[58] Field of Search ............ 372/46; 369/275.2, 44.23, 369/100

[56] References Cited

U.S. PATENT DOCUMENTS

| | | | |
|---|---|---|---|
| 3,736,046 | 5/1973 | Zook | 346/74 MT |
| 4,995,049 | 2/1991 | Kahen et al. | 372/46 |

FOREIGN PATENT DOCUMENTS

| | | |
|---|---|---|
| 354141 | 2/1990 | European Pat. Off. . |
| 404551 | 12/1990 | European Pat. Off. . |
| 62-275214 | 11/1987 | Japan . |
| 2178892 | 2/1987 | United Kingdom . |

OTHER PUBLICATIONS

Applied Physics Letters, vol. 54, No. 4, Jan. 23, 1989, "Integration of a Diode Laser and an Electronic Lens for Controlling the Beam Focus Position", S. Mukai et al, pp. 315-316.

*Primary Examiner*—John D. Lee
*Assistant Examiner*—Robert E. Wise
*Attorney, Agent, or Firm*—Fay, Sharpe, Beall, Fagan, Minnich & McKee

[57] ABSTRACT

The present invention relates to a laser diode and a highly precise light information processor using the same, particularly a laser diode which controls the diameter of a current flowing through an active layer and changes the emitting area of the active layer, a laser printer which is suited to half tone expression with high image quality by using the above semiconductor laser device, and an optical disk device which can record data surely.

23 Claims, 9 Drawing Sheets

LASER DIODE OF VARIABLE BEAM DIVERGENCE AND INFORMATION PROCESSOR USING THE SAME

BACKGROUND OF THE INVENTION

1. Field of the Invention

The present invention relates to a laser diode and an information processor using the same particularly such as an optical disk device or a laser printer using a semiconductor laser device (hereinafter called laser device or laser) which can control the beam divergence and the dot size of a light spot by controlling the size of beam emitting area.

2. Description of the Prior Art

FIG. 2 shows expressions of the print density of a conventional laser printer. In this drawing, the light beam scans from left to right and is irradiated in the hatched parts. In FIG. 2(a), the dot size of the light beam does not change and the print density is expressed by the magnitude of the dot density. In a part with a high print density, the dot density is increased so as to make the print deep, while, in a part with a low print density, the dot density is decreased so as to make the print light. To express a fine half tone using this method, a method that the dot density is increased by using a light spot with a small dot size so as to increase the number of light scanning lines and the light modulation count can be considered. However, since a mechanical method such as a polygon mirror is used to scan the light beam, the scanning speed cannot be easily improved and the number of scanning lines cannot be easily increased. An increase in the light modulation count increases the control time and lowers the print speed.

FIG. 2(b) shows an example wherein the magnitude of the dot density is expressed by changing the light beam shape. In this method, a long and narrow light spot is used in a part with a high dot density perpendicularly to the light scanning direction, and the number of light scanning lines and the light modulation count can be reduced. Japanese Patent Application Laid-Open No. 62-275214 shows an example of a focus variable element for changing the focal position of a light beam that is installed outside the laser, as shown in FIG. 3(a). In this case, fine adjustment for leading the laser beam to the focus variable element is required and it is extremely difficult to establish such a process. In S. Mukai et al, Applied Physics Lett. Vol. 54, No. 4, 23 Jan., 1989, pp 315 and 316, a semiconductor laser device that changes the shape of a light beam emitted from a laser diode by connecting a semiconductor element which serves as an another lens to the laser diode emitting a light beam in a predetermined shape is indicated. FIG. 3(b) shows an example of the configuration of the above semiconductor laser device. This semiconductor element changes a current flowing through the semiconductor element, changes the emission status of the light beam supplied from the laser diode, and changes the focal position of the light spot. This semiconductor laser device requires no adjustment when the semiconductor element is installed and can be made compact, though a technique for connecting the semiconductor element to the laser diode is required.

A light beam spot in a predetermined shape is used for recording, reproducing, or deleting an optical disk device, and an area necessary for recording, reproducing, or deleting information is obtained by the magnitude of the laser output power as shown in FIGS. 4(a) and 4(b). FIG. 4(a) shows an example of change of the laser output power with time during recording, and FIG. 4(b) shows an example of temperature distribution on a disk. The low laser output power P1 shown in FIG. 4(a) is equivalent to deletion and the area W1 where the temperature on the disk us higher than T1 shown in FIG. 4(b) is an area to be deleted. The high laser output power P2 is equivalent to recording and the area W2 where the temperature on the disk is higher than T2 is an area to be recorded. For overwriting with undeleted data minimized (W1>W2), the optical disk materials and laser beam accuracy have been improved.

SUMMARY OF THE INVENTION

One of the objects of the present invention is to improve the accuracy of a light information processor using a laser diode and another object of the present invention is to provide a laser diode for realizing a laser printer which is particularly suited to high accuracy printing or an optical disk device which can precisely record or delete information. A laser diode described in the present invention has a means for varying the emitting area, which electrically controls a current circuit for emitting a laser beam across an active layer. By varying the emitting area, the beam divergence emitted from the laser diode can be controlled. In an embodiment, the laser diode of the present invention has at least an active layer containing an emitting area, a pair of electrodes comprising a first electrode and a second electrode which are mounted on both sides of the active layer, a pair of cladding layers comprising a first cladding layer and a second cladding layer, a means for applying a backward bias voltage between a third electrode mounted in the first cladding layer and the first electrode so as to form a depletion layer, and a means for controlling the width of a current which is generated between the pair of electrodes and flows across the active layer by the depletion layer so as to change the laser beam emitting area in the active layer. According to the present invention, the laser diode can control the beam divergence and the focal position of the beam. Since no element other than the laser diode is used, when another element is combined, adjustment and connection for integration are not required, providing a smaller semiconductor laser device.

When this laser diode is used for a laser printer, for example, the dot shape of a light beam can be changed without mechanical control and a laser printer operating at high speed and with high precision can be realized. In another example wherein this laser diode is used for an optical disk device, information can be precisely recorded by increasing the shape of a light spot for deleting information so as to minimize undeleted data or by using a light spot with a shape smaller than that for deletion for recording information.

DETAILED DESCRIPTION OF THE PREFERRED EMBODIMENTS

Figure 1A:
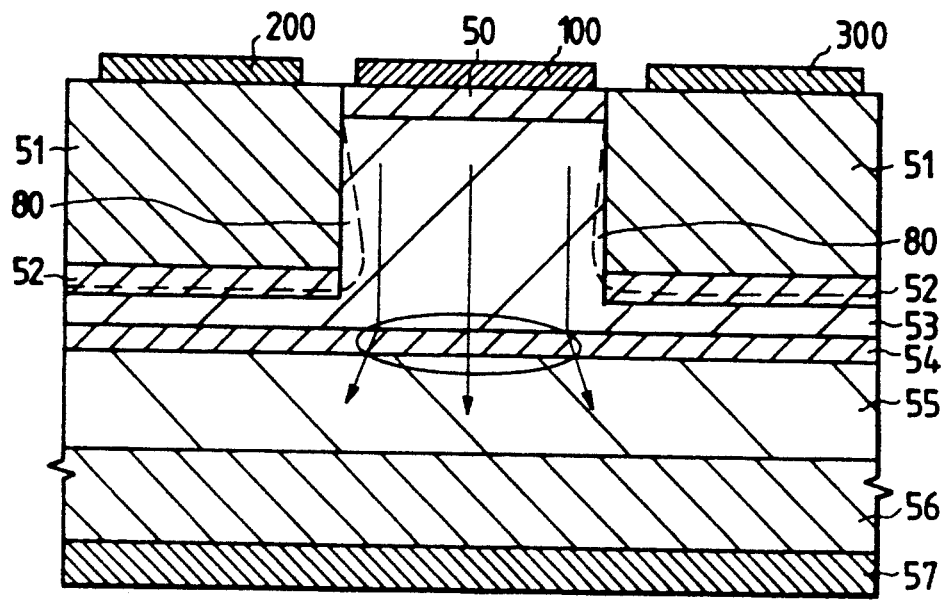
FIGS. 1a and 1b are partial sectional views showing a laser diode of an embodiment of the present invention.

The embodiments of the present invention will be described in detail hereunder with reference to the accompanying drawings.

FIG. 1 shows an enlarged view of the emitting area of the semiconductor laser device of the present invention, In FIG. 1, a P-type semiconductor 50 and a P cladding layer 53 are mounted between n-type semiconductors 51, though they may be reversely installed. An electrode 100 is an electrode for oscillating the laser, and a current flows in the direction of the arrow shown in the drawing. The n-type semiconductors 51 are mounted with the current flow put between them. The electrode 200 or 300 generates a backward bias voltage between the electrode 100 and itself so as to form a depletion layer in the P cladding layer 53. This depletion layer controls the width of a current flowing across an active layer so as to change the dot size of the light spot.

Figure 1B:
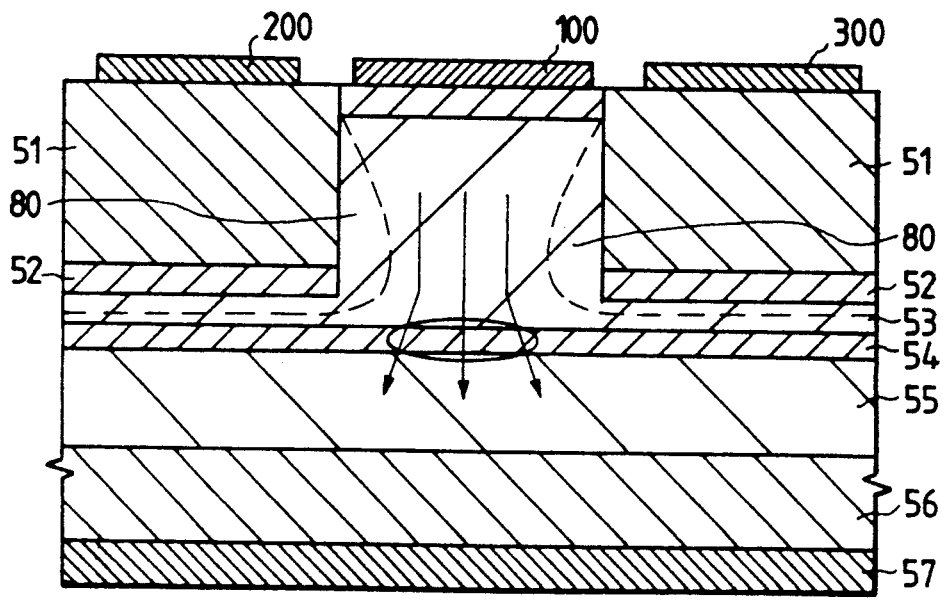

A potential higher than that of the electrode 100 is given to the electrodes 200 and 300. By doing this, the junction interface of the P-type semiconductor and each of the n-type semiconductors is reversely biased and a depletion layer 80 is formed. As shown in FIG. 1(a), when the backward bias voltage is low, the depletion layer 80 is small. As shown in FIG. 1(b), when the backward bias voltage is high, the depletion layer 80 is large. When the depletion layer 80 is small as shown in FIG. 1(a), the current flowing across the active layer becomes wider and the emitting area increases. When the depletion layer 80 is large as shown in FIG. 1(b), the current becomes narrower and the emitting area decreases. Since light spreads by diffraction, when the emitting area is wide, the beam divergence is small, while, when the emitting area is narrow, the beam divergence is large.

Next, the configuration and operation of a laser printer of the present invention will be described. The laser printer described hereunder uses a laser diode mentioned above as a light source.

Figure 5:
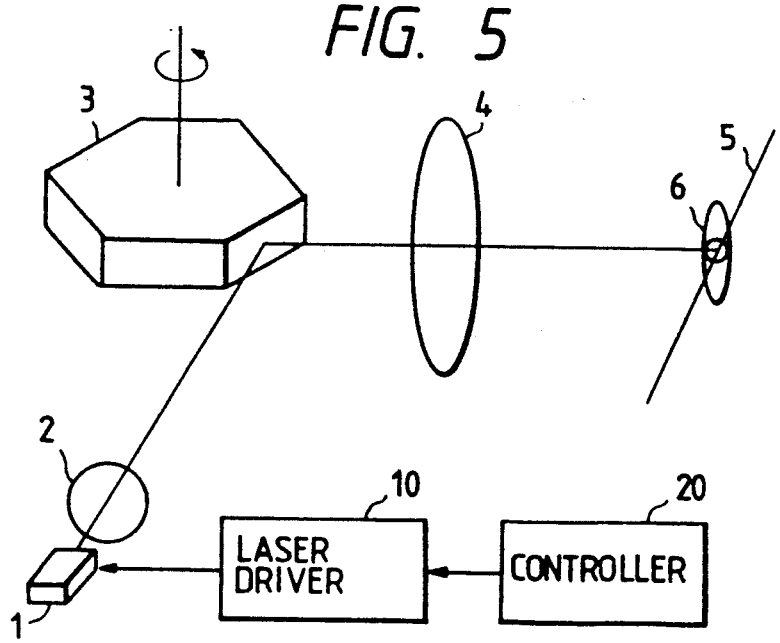
FIG. 5 is a schematic view of the optical system of a laser printer of another embodiment of the present invention.

FIG. 5 is a schematic view of a laser printer which uses a laser diode of the present invention as a light source. In FIG. 5, numeral 1 indicates a semiconductor laser device of the present invention, 2 a collimator lens, 3 a polygon mirror, 4 a scanning lens, 5 a photosensitive drum, and 6 a laser beam spot.

Figure 2A:
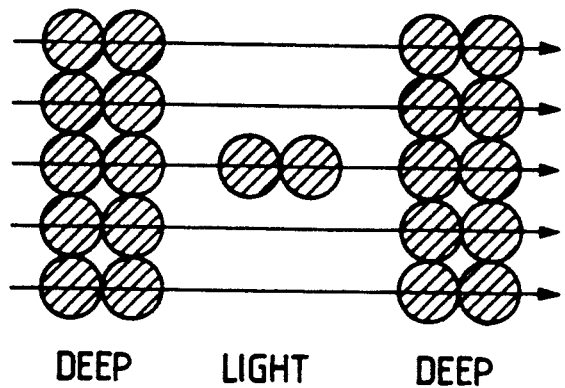
FIGS. 2a and 2b show the density expression method for printed matter by a laser printer.
Figure 2B:
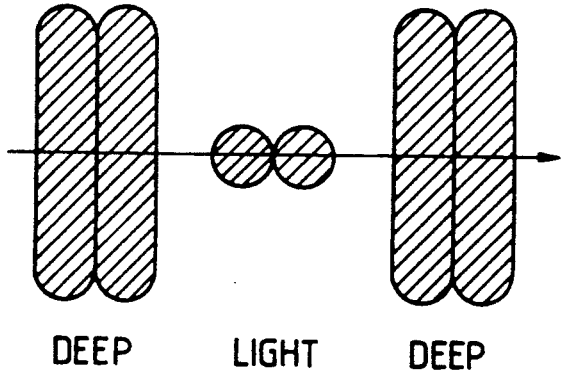
Figure 3A:
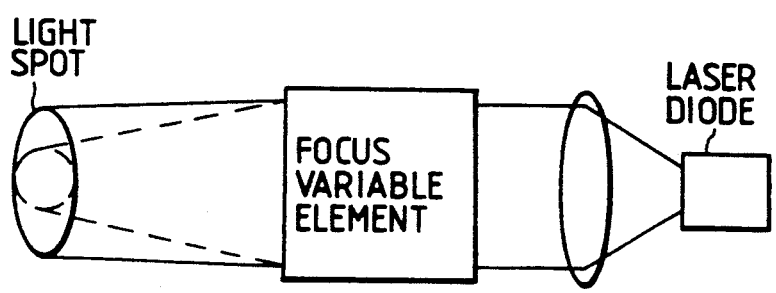
FIGS. 3a and 3b are schematic views showing an optical systems for changing the diameter of a light spot.
Figure 3B:
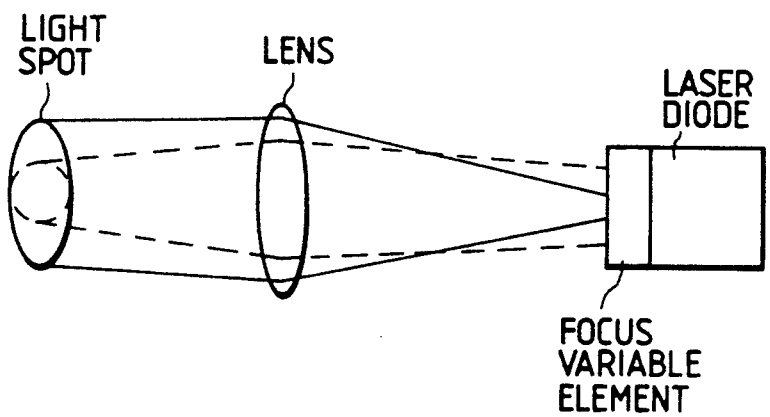

In an example shown in FIG. 5, light emitted from the semiconductor laser device 1 becomes parallel light flux after passing through the collimator lens 2. The parallel flux is scanned by the polygon mirror 3 and transmitted to the scanning lens 4, and a laser beam spot 6 with an optional diameter can be obtained on the photosensitive drum 5, which is a scanning surface, in the secondary scanning direction. Then, an instruction of the dot density or print contents is sent to a laser driver 10 from a controller 20 according to the print contents. The laser driver 10 modulates the laser beam or changes the light spot diameter according to the instruction from the controller 20. The light spot diameter is increased in a deep print area by the semiconductor laser device 1 or decreased in a light print area as shown in FIG. 2.

Figure 6:
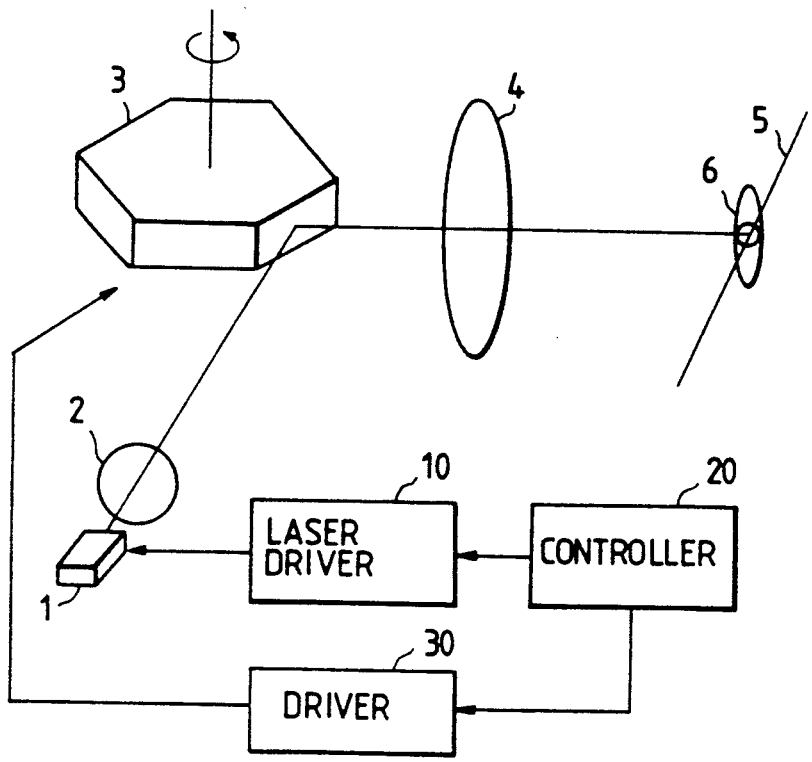
FIG. 6 is a schematic view of the optical system of a laser printer of another embodiment of the present invention.

FIG. 6 shows another schematic view of a laser printer which uses a semiconductor laser device of the present invention as a light source. In the embodiment shown in FIG. 6, a driver 30 for controlling the number of revolutions of the polygon mirror 3 is installed in addition to the configuration shown in FIG. 5. In the primary scanning direction, the beam intensity modulation pulse width is adjusted by the driver 30 and the dot density is changed by changing the exposure area. In the secondary scanning direction, the light spot diameter and the scanning interval are changed. As mentioned above, the light spot diameter is changed under voltage control by the laser driver 10, and the scanning interval is changed by changing the number of revolutions of the polygon mirror 3.

The driver 30 controls the mirror so that when the dot density increases according to an instruction from the controller 20, the number of revolutions of the polygon mirror 3 increases in correspondence to it and when the dot density decreases, the number of revolutions of the polygon mirror 3 decreases in correspondence to it. The dot density can be changed by such control. Therefore, when laser modulation and spot diameter control are made simultaneously with the above dot density change, graphics or characters can be enlarged or reduced in printing, and various prints such as fine half tone expression are available.

Next, the configuration and operation of a laser printer wherein a plurality of laser devices of the present invention are used and parallel scanning is performed by changing the interval of a plurality of laser beams in the secondary scanning direction according a change in the print density will be described as another embodiment of the present invention.

Figure 7:
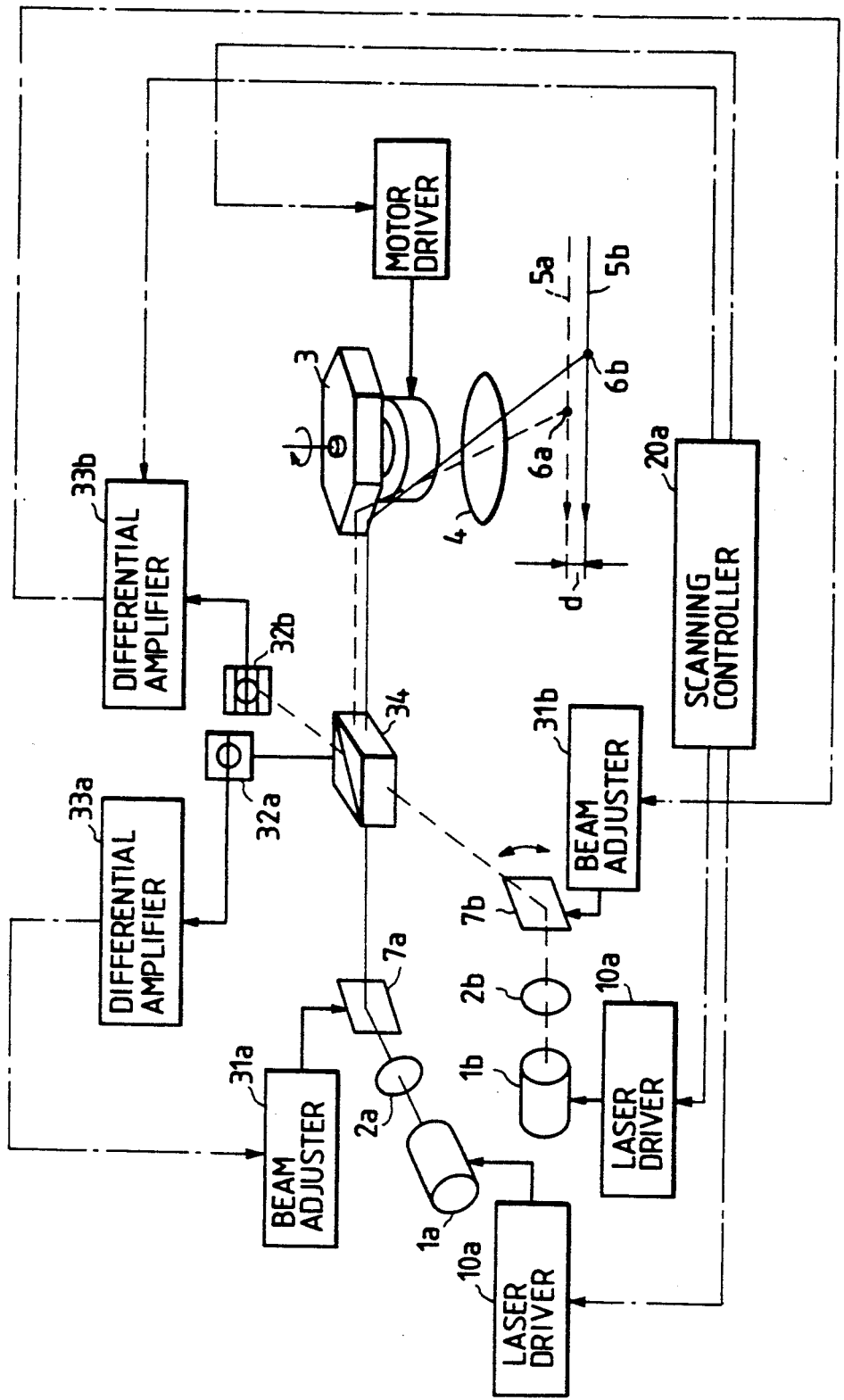
FIG. 7 is a schematic view of a laser printer of another embodiment of the present invention.

FIG. 7 shows the entire configuration of the laser printer. Two light sources 1a and 1b for emitting linearly polarized beams are used and the polarization directions are made almost perpendicular to each other (P, S). Laser beams emitted from the light sources 1a and 1b reach a polarization beam splitter 34 via lenses 2a and 2b and Galvano mirrors 7a and 7b.

The laser beams pass through the polarization beam splitter 34, advance in almost the same direction, pass through a polygon mirror 3 and a scanning lens 4, and are scanned on the scanning surface as scanning lines 5a and 5b. To keep the interval between the scanning lines 5a and 5b constant, a part of the beam is irradiated on beam position sensors 32a and 32b. Signals from the sensors 32a and 32b are sent to differential amplifiers 33a and 33b so as to maintain the beam interval constant.

The dot density may be changed as follows: By changing the exposure area by adjusting the beam intensity modulation pulse width for a dot signal in the primary scanning direction, the dot density can be changed. To change the dot density in the secondary scanning direction, it is required to change the number of revolutions of the polygon mirror 3 and also to change the interval between two beam spots 6a and 6b. For that purpose, it is desirable to change the division boundary of the above beam position sensor 32b in correspondence with the scanning line interval. When a plurality of beams are used like this, the dot density can be converted by changing the scanning line interval.

Furthermore, for printing with high image quality, it is required to change the laser beam spot diameter in the secondary scanning direction simultaneously with adjustment of the scanning interval. Therefore, lasers which can change the spot diameter are used as the light sources 1a and 1b. To decrease the dot density, the spot diameter in the secondary scanning direction is increased for the divergence of the scanning interval d. The spot diameter is changed under voltage control by beam diameter adjusters 10a and 10b by an instruction from a scanning controller 20a. In the above embodiment, since the scanning beam interval can be changed to a predetermined value when a plurality of beams are used for scanning and a means for changing the spot diameter of each scanning beam is installed, it is possible to convert the dot density and perform high quality printing. In the above embodiment, two beams are used. Needless to say, many beams may be used for parallel scanning.

Next, the operation of an optical disk device which uses a semiconductor laser device of the present invention as a light source will be described as another embodiment of the present invention.

Figure 8:
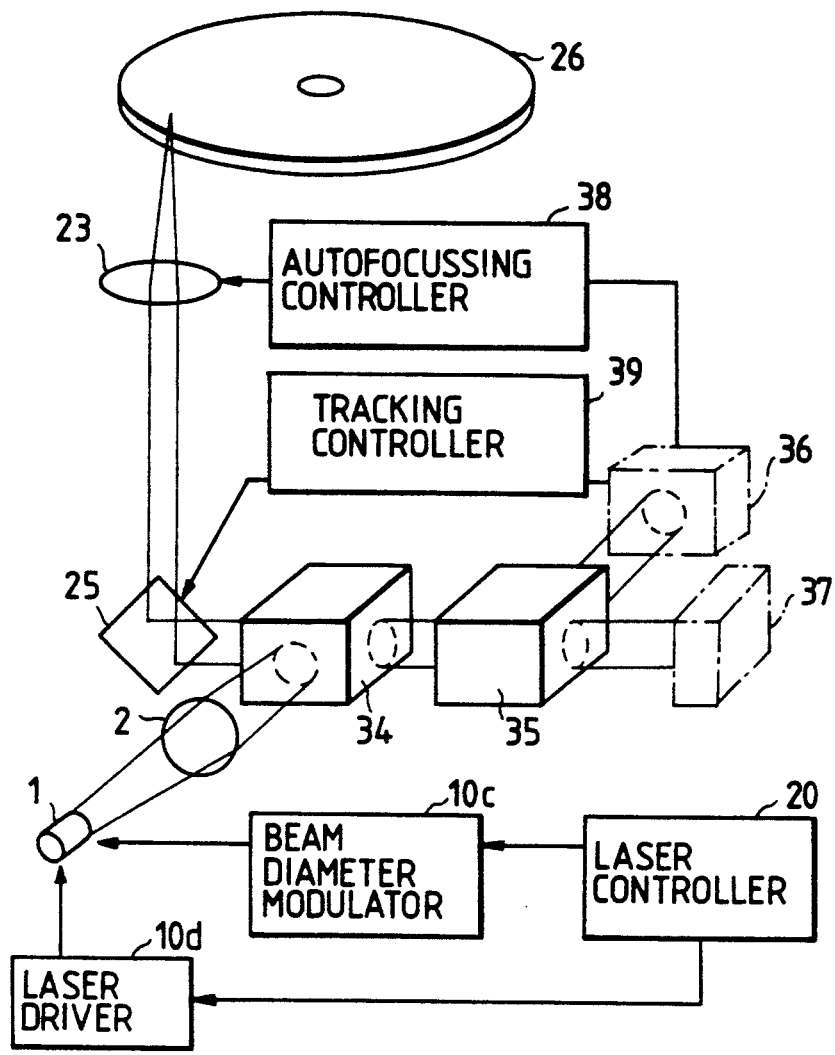
FIG. 8 is a schematic view of the optical system of an optical disk device of another embodiment of the present invention.

FIG. 8 is an entire schematic view of the optical system of an optical disk device using a laser device of the present invention. In FIG. 8, numerals 1 and 2 indicate a semiconductor laser device and a collimator lens of the present invention.

A light beam from the semiconductor laser device 1 passes through the collimator lens 2 and becomes a parallel beam. The parallel beam is reflected off of a beam splitter 34 and a Galvano mirror 25 and is focused on an optical disk 26 by a focusing lens 23. The reflected beam from the optical disk 26 passes through the beam splitter 34 and is sent separately to an autofocusing tracking signal sensor 36 and a reproduced signal sensor 37 by a beam splitter 35. An autofocusing controller 38 controls the focusing lens so as to focus the beam on the disk by an autofocusing signal. A tracking controller 39 controls the Galvano mirror 25 so as to keep the light spot on the track by a tracking signal. The reproduced signal sensor 37 detects information recorded on the optical disk 26 by the light intensity.

Figure 4A:
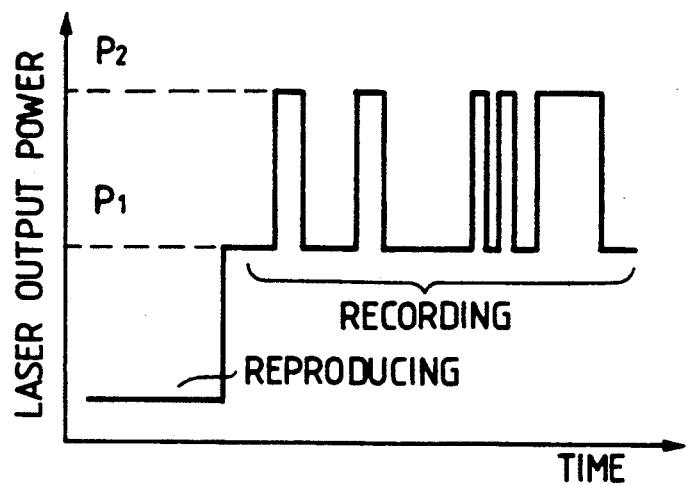
FIGS. 4a and 4b are graphs showing the relationship between the laser output power and time on an optical disk of a general optical disk device and the relationship between the temperature and light spot position.
Figure 4B:
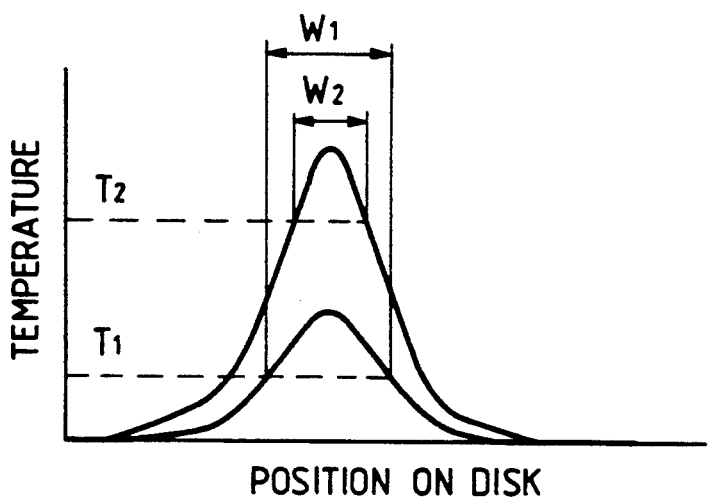

A laser driver 10d modulates the light intensity from the semiconductor laser device 1 as shown in FIG. 4(a) by an instruction from a laser controller 20 so as to record or reproduce information. A beam diameter modulator 10c modulates the beam diameter by an instruction from the laser controller 20 so as to lengthen the beam diameter in the radial direction when the laser output power for recording is low or to make the beam shape almost circular when the laser output power is high. As a result, when the laser output power for recording is high, the spot shape on the disk 26 is small circle or when the laser output power for deletion is low, the spot shape on the disk 26 is an ellipse which is long in the radial direction. The spot diameter is changed electrically in sufficient correspondence with the laser modulation speed. By doing this, the recorded temperature distribution difference (w1−w2) is increased and rewriting with an undeleted part minimized can be realized.

Next, an embodiment of a laser device of the present invention which can change the light spot diameter will be described.

Figure 9:
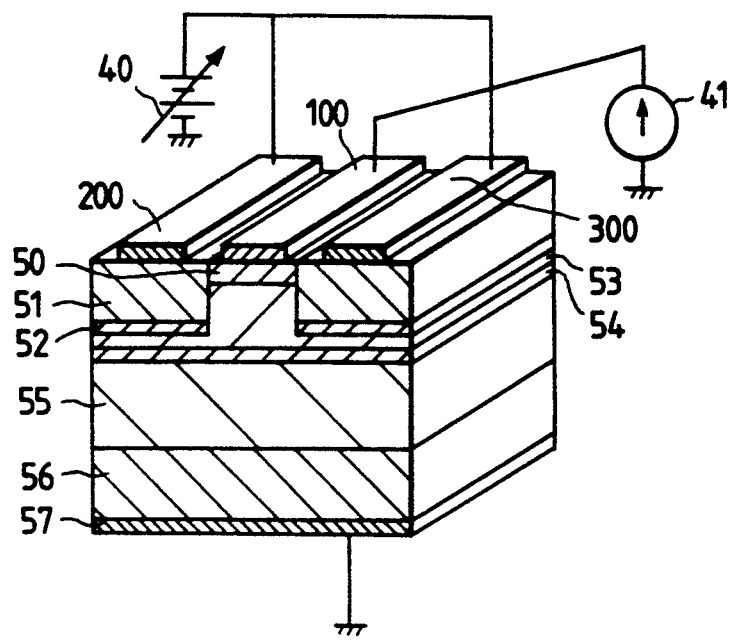
FIG. 9 is a partial perspective view of a laser diode of the present invention.

FIG. 9 shows the first embodiment of the semiconductor laser device used in FIGS. 5 to 8. In the semiconductor laser device shown in this embodiment, n-type semiconductor layers 51 are mounted on both sides of p-cladding layer 53, though they may be reversely installed. Stripe-shaped electrodes are mounted on them. Electrodes 100 and 57 are electrodes for oscillating the laser, and electrodes 200 and 300 are electrodes for changing the size of a laser beam spot. A current from a current source 41 flows from the electrode 100 to the electrode 57, and the part of an active layer 54 where the current crosses and emits light.

On the pn junction interface between each of the n-type semiconductor layers 51 and at least the p-cladding layer 53, a depletion layer is formed by the potential between the electrode 100 and the electrode 200 or 300. By changing the potential of a variable voltage source 40, the backward bias voltage applied to the above pn junction interface is changed and the divergence of the depletion layer can be changed. When the backward bias voltage is low, the divergence of the depletion layer is narrow and the current flowing from the electrode 100 to the electrode 57 is wide. Then, the active layer 54 emits light in an area which is wide in the lateral direction. When the backward bias voltage is high, the divergence of the depletion layer is wide and the current flowing from the electrode 100 to the electrode 57 is narrow. In this case, the emitting area of the active layer 54 is narrow in the lateral direction. When the emitting area is wide, the beam divergence is narrow. When the emitting area is narrow, the beam divergence is wide.

Since the p-cladding layer 53 and the active layer 54 are thin, when a high backward bias voltage is applied to them, a breakdown phenomenon occurs in them. To prevent a current from flowing through the p-cladding layer 53 and the active layer 54, a p-type semiconductor layer 52 is installed. When the etched surface of a wafer is exposed to air before regrowing the wafer, the surface may be damaged, causing a breakdown phenomenon. To prevent it, the p-type semiconductor layer 52 is mounted under the n-type semiconductor 51.

Figure 10:
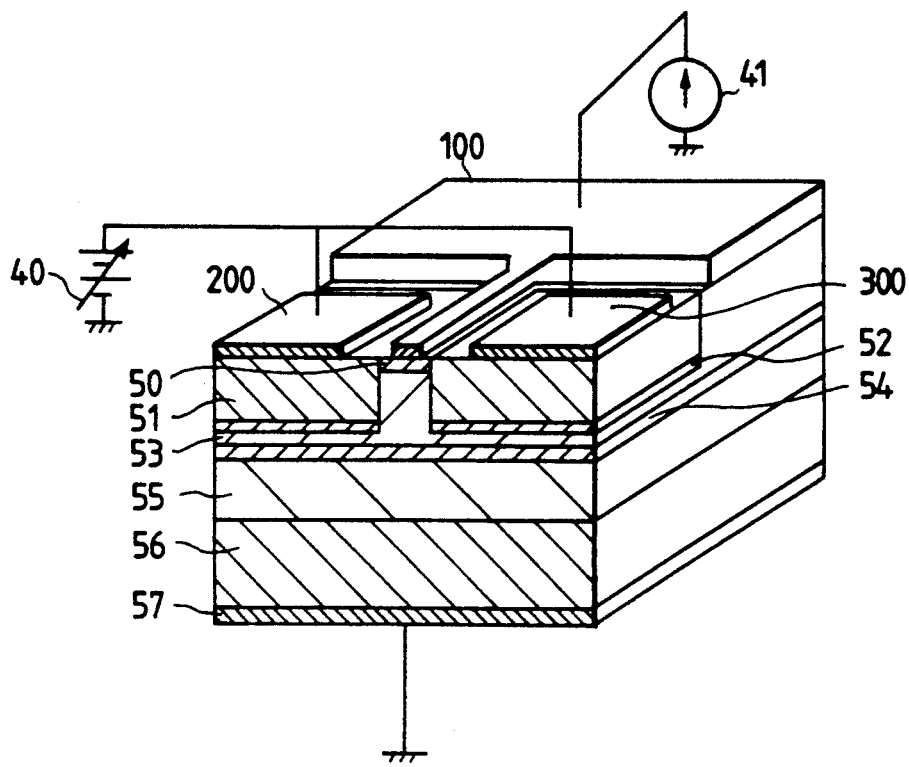
FIG. 10 is a partial perspective view of a laser diode of another embodiment of the present invention.

Another method for preventing the breakdown phenomenon is to use an insulation layer in place of the p-type semiconductor layer 52. An oxide layer, a nitride layer, or air may be used as an insulation layer. When air is used as an insulation layer, in the case of GaAs, for example, a method that n-GaAlAs is grown in place of the n-type semiconductor layer 51, p-GaAs in place of the p-type semiconductor layer 52, and p-GaAlAs in place of the p-cladding layer 53, and only p-GaAs is selectively etched later is possible. In the embodiment shown in FIG. 9, the n-type semiconductor layers 51 are embedded on both sides of the p-cladding layer 53 and the current flowing width is changed by using the depletion layer. An effect may be produced by providing the structure only at the emission end. FIG. 10 shows a configuration example that the n-type semiconductor layer 51 is embedded in only a part including the emission end of the p-cladding layer 53. The configuration of the other layers is the same as that shown in FIG.

9. In this structure, the electrode 100 can be made wider, providing an advantage of easy external connection.

Figure 11:
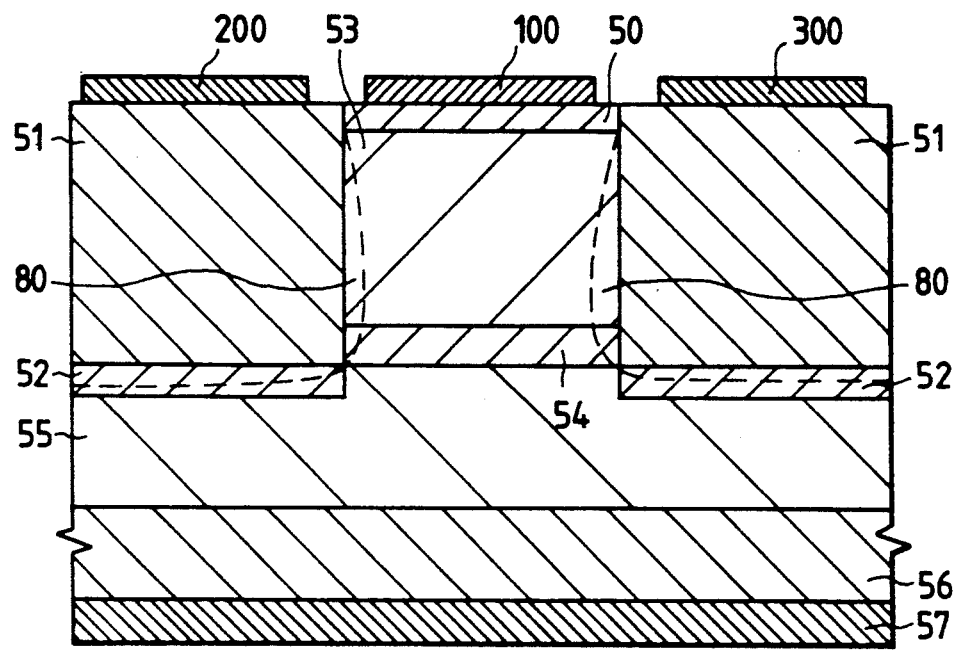
FIG. 11 is a partial perspective view of a laser diode of another embodiment of the present invention.

According to the structure shown in the above embodiment, the current flowing width is controlled in the clad layer and the emitting area of the active layer is changed. FIG. 11 shows a structure that the current flowing width is changed in the active layer on the same principle. The etching depth in FIG. 11 is deeper than that shown in FIG. 1 and reaches an n-cladding layer 55. By adding electrodes 200 and 300 to this structure as shown in FIG. 9 or 10 and changing the voltages thereof, the divergence of the depletion layer is changed.

When no substance for confining the current in the active layer in the lateral direction is provided, the current spreads. Therefore, the configuration shown in FIG. 11 can change the light spot diameter effectively compared with that shown in FIG. 1. In this embodiment, the active layer 54 uses a p-type semiconductor because when an n-type semiconductor is used, a current flows between the n-type semiconductor layer 51 and the n-cladding layer and the active layer 54 cannot play a part as a semiconductor laser active layer. Therefore, a depletion layer is formed on the interface between the active layer 54 and the n-type semiconductor layer 51 by applying a backward bias voltage between the electrode 100 and the electrode 200 or 300, and the light spot emitting area can be controlled. In this embodiment, the p-type semiconductor layer 52 is mounted so as to prevent the current from flowing below the embedded layer. A p-type semiconductor layer is installed so as to prevent the n-type semiconductor 51 from touching the n-cladding layer 55. An insulation layer may be used in place of the p-type semiconductor layer 52 as mentioned above.

According to the above embodiment, a laser diode with a simple configuration can change the light spot diameter and divergence.

The above embodiment and application examples are just examples. Needless to say, there are no limitations on them.

According to the present invention, as described above in detail, a semiconductor laser device which is suitable for changing the light spot diameter and controlling the laser beam divergence and can be manufactured easily can be realized.

When the semiconductor laser device of the present invention is applied to a laser printer, fine half tone expression is available, and graphics can be enlarged or reduced easily when laser modulation and spot diameter control are performed simultaneously.

When the semiconductor laser device of the present invention is applied to a recording means of an optical disk device, no error occurs in the track width direction and rewriting with an undeleted part minimized is available.

What is claimed is:

1. A laser diode comprising at least an active layer, a first electrode and a first cladding layer on one side thereof against said active layer and a second cladding layer and a second electrode on the other side thereof against said active layer, a current source connected to said electrodes so that a path of current flows therethrough, and a means for controlling the path of current flowing between said first electrode and said second electrode in said first cladding layer, wherein said current path control means has a third electrode biased with respect to one of said first and second electrodes.

2. A laser diode according to claim 1, wherein a backward bias voltage between said first electrode and said third electrode is in inverse proportion to the size of said emitting area.

3. A laser diode according to claim 1, wherein said third electrode applies to a backward bias voltage to said first electrode so as to form a depletion layer in said first cladding layer.

4. A laser diode according to claim 3, wherein said current path control means is formed in said first cladding layer so that said control means do not touch said first electrode and said active layer.

5. A laser diode according to claim 1, wherein said third electrode applies a backward bias voltage to said first electrode so as to form a depletion layer in said active layer.

6. A laser diode according to claim 1, further comprising said first cladding layer being one of p-type and n-type semiconductor material and being mounted between opposed first and second layers of the other of the p-type and n-type semiconductor material, each of said opposed layers having electrodes wherein one of said electrodes is said third electrode and the other of said electrodes is a fourth electrode, wherein said current path control means biases both said third and fourth electrodes with respect to said one of said first and second electrodes to form a depletion layer in said first cladding layer.

7. A laser diode according to claim 6, further comprising an intermediate layer formed between each of said opposed layers and said first cladding layer, respectively, for preventing breakdown when a reverse bias voltage is applied between said first cladding layer and said active layer.

8. A laser diode according to claim 7, wherein said intermediate layer is said one of a p-type and n-type semiconductor material.

9. A laser diode according to claim 7, wherein said intermediate layer is an insulation layer.

10. A laser printer comprising a laser diode having at least an active layer containing an emitting area, a pair of electrodes for providing current flow in said emitting area and a pair of cladding layers on both sides of said active layer, and a depletion layer formed so as to narrow the path of current flowing in said active layer, a scanning means for scanning a laser beam emitted from said laser diode on a recording medium, and an imaging means for forming an image on said recording medium from said laser beam, wherein the shape of the laser beam which is imaged on said recording medium when said depletion layer is formed is long in the direction perpendicular to the scanning direction of said laser beam.

11. A light information processor, comprising:
a laser diode having at least two current paths which emits light by current flowing through a first current path, and in which the current flow through the first current path is controlled by current flowing through a second current path;
an optical system in which a light beam emitted from said laser diode is shaped into a light spot and is directed onto a recording medium; and
a controller for controlling the current flowing through said second current path to shape said light spot into a predetermined shape.

12. A light information processor according to claim 11, wherein said light spot varies in shape in a direction perpendicular to a relative propagating direction of said light spot according to a change in the current flowing through said second current path.

13. A light information processor according to claim 12, wherein said laser diode comprises at least an active layer including an emitting area; a first electrode and a first cladding layer on one side thereof against said active layer; and a second cladding layer and a second electrode on the other side thereof against said active layer, and wherein said first current path lies between said first electrode and said second electrode.

14. A light information processor according to claim 13, wherein said laser diode comprises a third electrode on one side thereof against said active layer and wherein said second current path lies between said first electrode and said third electrode.

15. A light information processor according to claim 14, wherein backward bias current flows through said second current path.

16. A light information processor according to claim 15, wherein said backward bias current is in inverse proportion to a size of said emitting area.

17. A light information processor according to claim 15, wherein said backward bias current is in inverse proportion to a size of an area of said recording medium irradiated by said light spot.

18. A light information processor according to claim 15, wherein a depletion layer is formed in said first cladding layer by applying said backward bias current so that the current flowing through said first current path is controlled.

19. A light information processor according to claim 15, wherein a depletion layer is formed in said active layer by applying said backward bias current so that the current flowing through said first current path is controlled.

20. A laser diode, comprising:
a substrate provided with a first electrode on one side thereof;
a first cladding layer formed on said substrate;
an active layer formed on said first cladding layer;
a second cladding layer formed on said active layer; and
a second electrode and a third electrode formed on said second cladding layer;
wherein the current flowing between said first electrode and said second electrode crosses said active layer to emit light, and
wherein a depletion layer is formed by applying a backward bias voltage between said third electrode and said second electrode to control a path of said current.

21. A laser diode according to claim 20, wherein said second cladding layer has a third cladding layer contacting said third electrode and said depletion layer is formed at the junction interface between said second cladding layer and said third cladding layer.

22. A laser diode according to claim 21, wherein said third electrode is comprised of two electrodes disposed above said second cladding layer.

23. A laser diode according to claim 21, wherein said laser diode further comprises a third cladding layer contacting said second cladding layer, said active layer and said third electrode and said depletion layer being formed in the vicinity of said junction interface of said third cladding layer.

* * * * *